(12) United States Patent
Du et al.

(10) Patent No.: US 6,945,672 B2
(45) Date of Patent: Sep. 20, 2005

(54) LED PLANAR LIGHT SOURCE AND LOW-PROFILE HEADLIGHT CONSTRUCTED THEREWITH

(75) Inventors: Shawn X. Du, Macedonia, OH (US); Michael C. Hsing Chen, North Olmsted, OH (US); Thomas F. Soules, Richmond Heights, OH (US); Frank P. Dornauer, Valley City, OH (US); Tomislav J. Stimac, Concord, OH (US); Robert Schindler, Euclid, OH (US)

(73) Assignee: GELcore LLC, Valley View, OH (US)

( * ) Notice: Subject to any disclaimer, the term of this patent is extended or adjusted under 35 U.S.C. 154(b) by 165 days.

(21) Appl. No.: 10/064,942

(22) Filed: Aug. 30, 2002

(65) Prior Publication Data

US 2004/0042212 A1 Mar. 4, 2004

(51) Int. Cl.⁷ .............................. F21V 1/00; H01J 63/04
(52) U.S. Cl. .................... 362/241; 362/247; 362/294; 362/545; 313/512
(58) Field of Search ............................ 362/241, 245, 362/545, 307, 311, 326, 327, 247; 313/512, 113; 257/98

(56) References Cited

U.S. PATENT DOCUMENTS

| | | | |
|---|---|---|---|
| 5,136,483 A | * | 8/1992 | Schoniger et al. .......... 362/545 |
| 5,660,461 A | * | 8/1997 | Ignatius et al. ............. 362/241 |
| 6,345,903 B1 | * | 2/2002 | Koike et al. ................ 362/249 |
| 6,527,411 B1 | * | 3/2003 | Sayers ........................ 362/245 |
| 6,547,423 B2 | * | 4/2003 | Marshall et al. ............ 362/333 |
| 6,641,284 B2 | * | 11/2003 | Stopa et al. ................ 362/240 |

FOREIGN PATENT DOCUMENTS

| | | |
|---|---|---|
| DE | 199 22 176 A1 | 11/2000 |
| EP | 1 026 032 A2 | 8/2000 |
| EP | 1 077 344 A2 | 2/2001 |
| EP | 1 077 344 A3 | 1/2004 |
| JP | 10125959 | 5/1998 |
| JP | 10-200168 | 7/1998 |
| JP | 11162219 | 6/1999 |

* cited by examiner

*Primary Examiner*—Ali Alavi
(74) *Attorney, Agent, or Firm*—Fay, Sharpe, Fagan, Minnich & McKee, LLP

(57) ABSTRACT

A light source (10) includes a light emitting semiconductor device (12). A support substrate (14) has a generally planar reflective surface (28) that supports the semiconductor device (12). The light emitting semiconductor device heat sinks via the support substrate. A curved reflector (16) has a concave parabolic reflective surface. The light emitting semiconductor device (12) is arranged between the support substrate (14) and the curved reflector (16). The support substrate (14) and the curved reflector (16) together define a light aperture (18) through which light produced by the light emitting semiconductor device (12) passes.

38 Claims, 11 Drawing Sheets

LED PLANAR LIGHT SOURCE AND LOW-PROFILE HEADLIGHT CONSTRUCTED THEREWITH

BACKGROUND OF INVENTION

The present invention relates to the lighting arts. It especially relates to a rugged solid-state plane wave light source for producing a substantially plane wave light beam that is suitable for vehicle headlights and other applications, and will be described with particular reference thereto. However, the invention will also provide solid-state light sources producing other types of light distributions, such as light that is focused in one dimension and planar in an orthogonal dimension, plane wave light that is angularly tilted, and the like, for use in downlighting and other applications throughout the lighting arts.

Present vehicular headlights typically employ filament-based light sources such as halogen lamps, or high-intensity discharge lamps that produce electric arc illumination by electrical discharge between electrodes in a high-pressure gas ambient. Such light sources produce a generally point source of light, which is collected and directed by optics typically including a back-reflector and front lens. The optics preferably produce a beam that is forwardly directed in front of the vehicle, and a diameter or size of the back-reflector and front lens controls the headlight beam size.

In the United States, vehicles typically have both high-beam and low-beam headlights, the former being used on substantially empty country roads and highways to provide maximum forward illumination, and the latter being used in cities or other populated roadways. The low-beam headlights are a compromise between providing forward illumination for the driver and avoiding glare and possible blinding of oncoming traffic by the vehicle headlights. The low-beam headlights are designed and mounted on the vehicle in a manner which concentrates the low-beams below the horizontal, i.e. onto the road rather than toward oncoming traffic. The low-beams are also preferably used in snowy, rainy, or foggy driving conditions to reduce back-scattered headlight illumination which can blind the driver.

Existing headlights have certain disadvantages. They are large, particularly in the vertical direction, which degrades aerodynamic performance and aesthetic qualities of vehicles. Vehicle designers are further constrained because two separate sets of headlights for the low-beams and the high-beams are typically used to provide both illumination modes.

In response to these aerodynamic and aesthetic styling issues, vehicle headlights are usually custom-designed for a particular vehicle model and make. This increases headlight cost. Some vehicles use "sealed beam" headlights in which the halogen or discharge lamp, the back-reflector, and the forward lens are integrated into a single hermetically sealed unit. When a sealed beam headlight fails for any reason, the entire sealed beam unit must be replaced. Alternatively, some vehicles use a headlight housing including the back-reflector and the forward lens, and a separate halogen or discharge lamp that inserts into a receptacle of the back-reflector. These headlights permit replacement of the failed lamp without replacing the optics, but increase a likelihood of headlight misalignment due to the additional detachable lamp connection.

Another disadvantage of incandescent halogen or discharge lamps is limited reliability and a catastrophic failure mode. The wire filaments of incandescent light sources are fragile, and halogen headlights in particular are typically short-lived. Discharge lamps include high-pressure gas contained in a transparent glass or plastic bulb, and can present shatter hazards. Moreover, both incandescent and discharge lamps employ a single light source which is shaped into a beam by optics. Hence, failure of the light source, for example by breakage of the incandescent filament or leakage of the high-pressure discharge gas, results in complete failure of the headlight, which creates a driving safety hazard.

The present invention contemplates an improved apparatus and method that overcomes the above-mentioned limitations and others.

SUMMARY OF INVENTION

According to one aspect of the present invention, a light source is disclosed, including a light emitting semiconductor device. A support substrate has a generally planar reflective surface that supports the semiconductor device. The light emitting semiconductor device heat sinks via the support substrate. A curved reflector has a concave parabolic reflective surface. The light emitting semiconductor device is arranged between the generally planar reflective surface and the concave parabolic reflective surface. The support substrate and the curved reflector together define a light aperture through which light produced by the light emitting semiconductor device passes.

According to another aspect of the present invention, a headlight for a vehicle is disclosed. The headlight includes a support surface and a plurality of light emission modules. Each light emission module includes a reflective cup including a planar portion and a parabolic portion joined together at a parabolic interface. An open end of the parabolic portion defines a light output opening. Each light emission module further includes a light emitting semiconductor die that is attached to the planar portion of the reflective cup and is oriented to produce light directed toward the parabolic portion of the reflective cup. The light emission modules are arranged on the support surface with the planar portion of each reflective cup parallel to the support surface and the light output openings of the reflective cups arranged such that the plurality of light emission modules produce a cumulative light beam.

According to yet another aspect of the present invention, a solid-state light source is disclosed, including a solid-state light emitting device and a reflector. The reflector includes a generally planar side and a generally concave curved side facing the generally planar side. The solid-state light emitting device is supported by the generally planar side and emits light generally directed toward the concave curved side. The reflector further includes an opening defined by edges of the generally planar side and the generally concave curved side toward which the generally planar side and the generally concave curved side cooperatively direct light produced by the solid-state light emitting device.

According to still yet another aspect of the present invention, a method is provided for manufacturing a light source. A light emitting semiconductor die is secured to a reflective planar surface. An encapsulant is applied over the light emitting semiconductor die to seal the die. The applying defines an encapsulant surface having an aperture side and a curved side. A reflective layer is applied to the curved side of the encapsulant.

Numerous advantages and benefits of the present invention will become apparent to those of ordinary skill in the art upon reading and understanding the following detailed description.

BRIEF DESCRIPTION OF DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION

Figure 1:
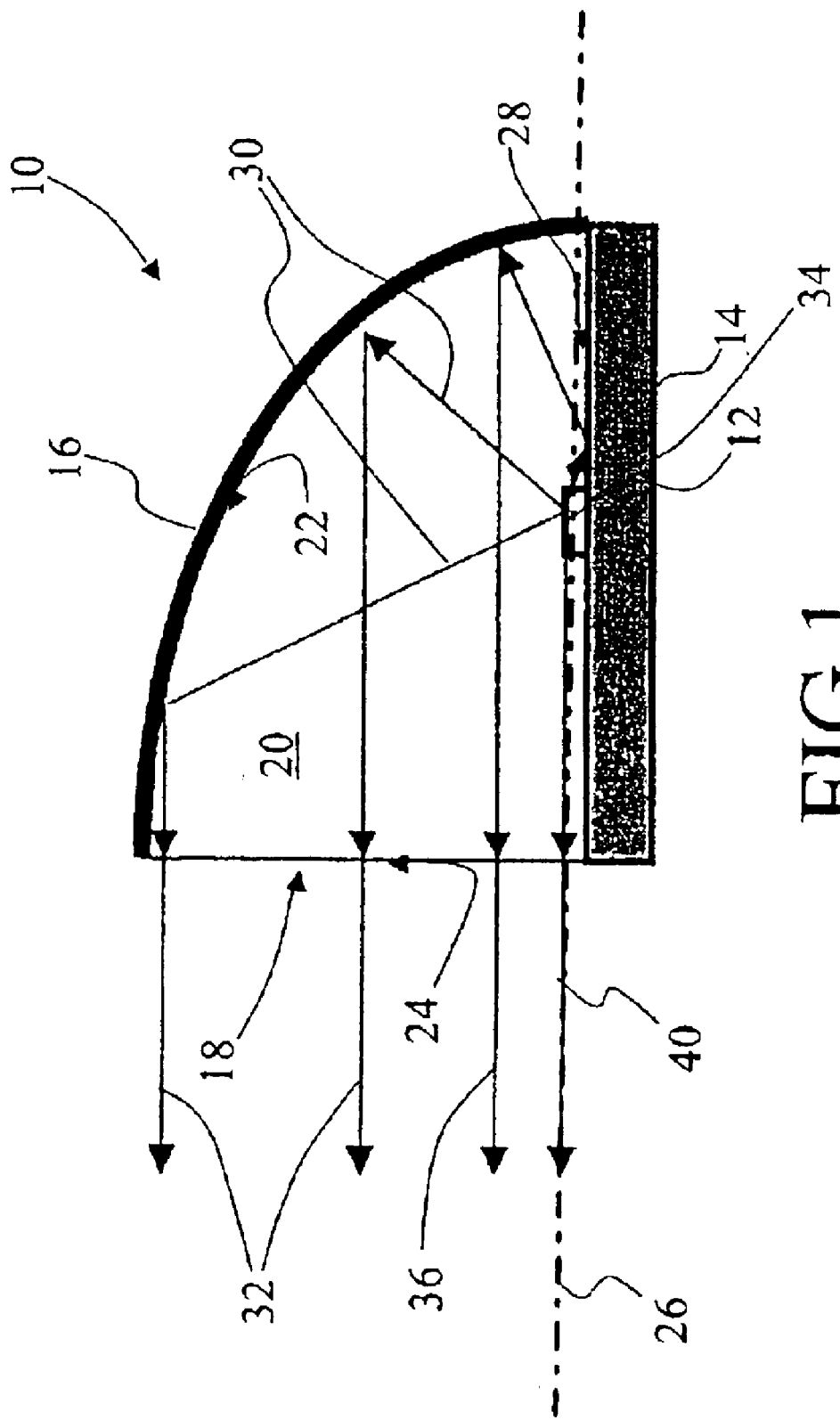
FIG. 1 shows a side sectional view of a first embodiment of a light source, including selected light ray traces.
Figure 2:
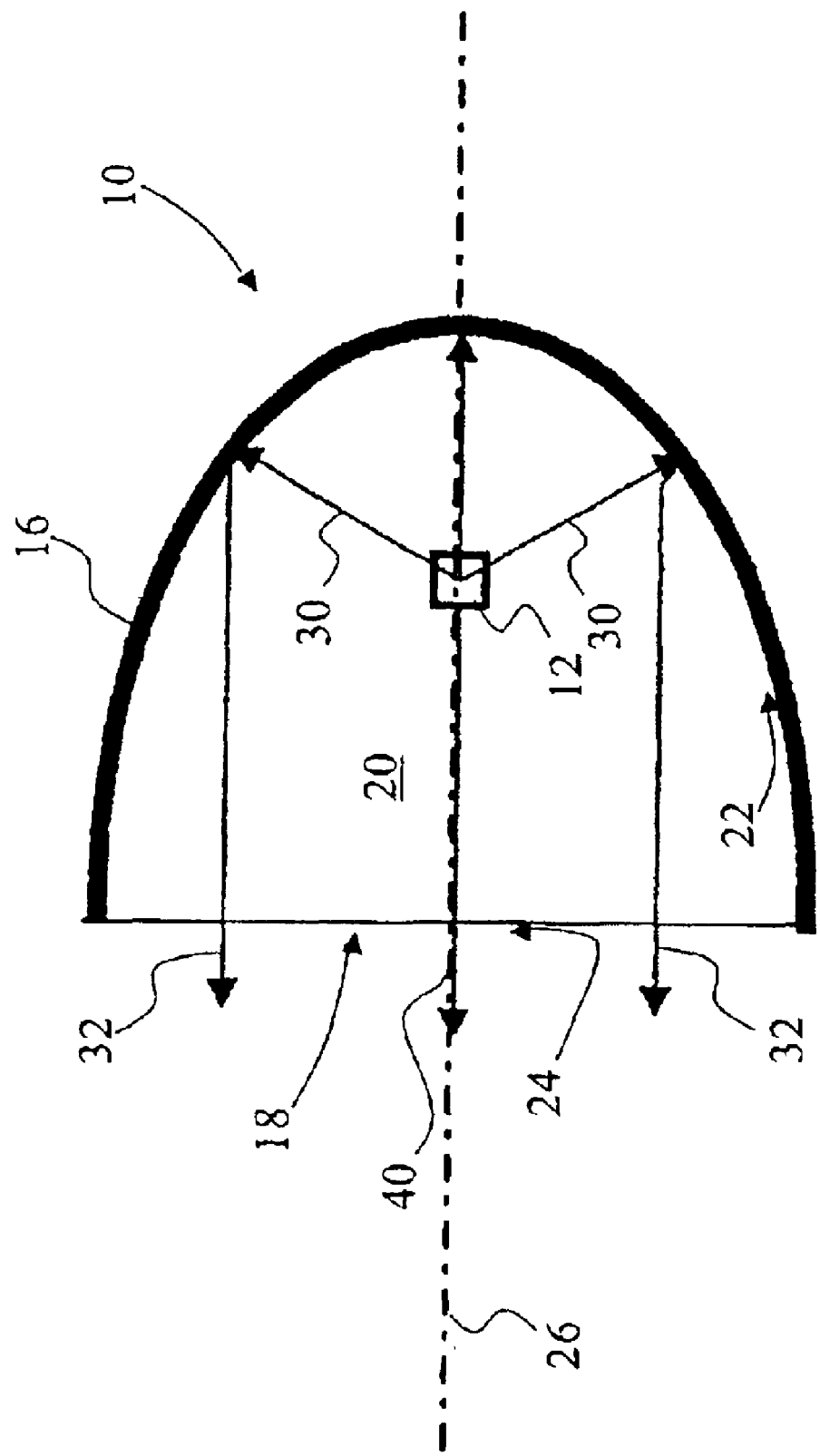
FIG. 2 shows a view from below of the first embodiment with the planar reflective substrate removed to expose the light emitting semiconductor die, the drawing further including selected light ray traces.

With reference to FIGS. 1 and 2, a light source 10 includes a light emitting semiconductor device 12 supported by a reflective support substrate 14. Typically, the semiconductor device 12 is a semiconductor die cut from a wafer and attached to the support substrate 14 by soldering, epoxy adhesion, or another method. Optionally, the semiconductor device 12 and the support substrate 14 are monolithically integrated, i.e. the support substrate 14 is a polished semiconductor substrate on which the light emitting semiconductor device 12 is fabricated using a selected combination of epitaxial crystal growth, photolithography, impurity diffusion, metal deposition, and/or other semiconductor processing techniques. In the monolithic embodiment, the semiconductor substrate is optionally coated with a metal to increase its reflectivity.

Preferably, the reflective support substrate 14 includes a primary heat sinking path for the light emitting semiconductor device 12. The substrate 14 is suitably part of a heat sink or connected with a heat sink in a thermally conductive manner. The light emitting semiconductor device 12 is mounted on the substrate 14 with its principle light-emitting face directed upward and away from the substrate 14. Hence, gallium nitride (GaN) based light-emitting diodes (LEDs) with sapphire backsides or other light emitting semiconductor devices with translucent or transparent backsides can be configured and mounted in a flip-chip arrangement which is both convenient and provides good thermal transport between the device and the substrate 14. Other suitable surface mount techniques can also be used. It is also contemplated to include a sub-mount to improve thermal conduction between the light emitting semiconductor device 12 and the substrate 14.

A curved reflector 16 having a concave reflective surface defines, together with a portion of the reflective support substrate 14, a reflective cup or cavity with an opening or light aperture 18, inside of which cup or cavity the light emitting semiconductor device 12 is disposed. Preferably, the cavity is filled with a light transmissive encapsulant 20 that encapsulates the light emitting semiconductor device 12 and a portion of the support substrate 14 contained within the reflector 16. The encapsulant 20 preferably further extends upward away from the support substrate 14 to define a curved surface 22 that comports with the curved reflector 16. The encapsulant further includes a substantially planar light-transmissive surface 24 that fills the opening or light aperture 18.

In one suitable method of fabrication, the light emitting semiconductor device 12 is bonded to the substrate 14. The encapsulant 20 is formed over the semiconductor device 12 by injection molding, i.e. by arranging a suitable mold over the light emitting semiconductor device 12, injecting the encapsulant as a liquid epoxy or other fluid or malleable solid into the mold, and removing the mold after the epoxy or other fluid or malleable solid solidifies to form the encapsulant 20. The portion of the reflective support substrate 14 contained within the reflector 16 serves as a lower mold surface which is not removed and to which the encapsulant 20 preferably bonds upon solidification.

After the encapsulant 20 is formed, the curved reflector 16 is disposed on the encapsulant 20 as a reflective coating deposited or otherwise applied to the curved surface 22 of the encapsulant 20. During application of the curved reflector 16, the planar light-transmissive surface 24 is optionally masked to prevent metal coating of the light-transmissive surface 24. However, when using certain types of metal deposition, such as vacuum deposition, proper arrangement of the deposition source relative to the epoxy 20 substantially prevents deposition on the light-transmissive surface 24, and so the masking can be omitted. Optionally, the planar light-transmissive surface 24 is planarized or polished to improve light transmission through the surface 24.

In another suitable method of fabrication, the support substrate 14 and the curved reflector 16 are formed as two separate pieces that are soldered, welded, or otherwise bonded together to form a single unitary reflector cup. Alternatively, the support substrate 14 and the curved reflector 16 are molded, cast, hydroformed, or otherwise produced as a single unitary reflector cup. The light emitting semiconductor device 12 is bonded to the substrate 14 within the reflector cup by soldering, epoxy, or the like, and the encapsulant 20 is optionally applied as an epoxy or other fluid or malleable solid to fill the reflector cup.

Prior to encapsulation, the light emitting semiconductor device 12 is electrically connected by wire bonding, flip-chip bonding, or the like, to electrodes (not shown) arranged on or in the support substrate 14, or arranged outside the cavity or cup. Optionally, the support substrate 14 is a printed circuit board which includes electrical traces for electrically connecting the semiconductor device 12. In the case of a monolithically integrated semiconductor device 12 and support substrate 14, cooperating electrical traces and insulating films are applied during monolithic device fabrication using known techniques to define electrical pathways.

The light emitting semiconductor device 12 is typically a light emitting diode (LED), a vertical cavity surface emitting laser (VCSEL), or the like. As is known in the art, such devices emit substantial amounts of light responsive to energizing the device via positive and negative (also called p-type and n-type) contacts. The light emitting semiconductor device 12 is arranged with its principle lightface or side facing away from the support substrate 14 and toward the curved reflector 16. As is known in the art, LEDs typically emit light having an approximately Lambertian or otherwise directional distribution in which the light intensity decreases with increasing angle away from a surface normal of the light-emitting face.

Similarly, VCSELs emit light directed away from a principle light-emitting face with a light distribution defined by dimensions and optical properties of an optical cavity formed by paired distributed Bragg reflectors (DBRs). Because the VCSEL cavity is narrow, e.g. typically about 10 microns wide or less, light collimation by the cavity is weak, the VCSEL typically operates in multiple resonance modes, and so the light distribution is typically conical or wedge-shaped rather than plane wave, with an angular distribution centered along a surface normal of the principle light-emitting face.

The light emitting semiconductor device 12 arranged with its principle lightface or side facing away from the support substrate 14 emits light principally directed toward the curved reflector 16 with a Lambertian, conical, or otherwise angularly spread-out light distribution. The curved reflector 16 is preferably a half-parabolic curved reflector with an optical or parabolic axis 26. As is known in the art, a parabolic reflector has a substantially paraboloid curvature corresponding to a rotation of a parabolic curve about a parabola axis, with the paraboloid surface of the parabolic reflector terminating at a plane substantially perpendicular to the parabola axis arranged at a selected distance from a parabola vertex to define an open end of the parabolic reflector. The half-parabolic curved reflector 16 further terminates at a plane containing the parabolic axis 26, which plane generally coincides with a substantially planar reflective surface 28 of the support substrate 14 or with the light-emitting semiconductor device 12 arranged thereon.

Moreover, the light-emitting semiconductor device 12 is preferably located approximately at a focus of the half-parabolic curved reflector 16. As is known in the art, the focus is a particular point along the parabolic axis 26 having special optical significance. Because of the paraboloid surface of the curved reflector 16, light emanating from the semiconductor device 12 positioned at the focus is reflected and redirected into parallel rays that pass out the open end of the reflector to form a plane wave light output. That is, light rays 30 emanating from the light-emitting semiconductor device 12 are reflected and redirected by the half-parabolic curved reflector 16 into substantially parallel light rays 32 directed out the opening or light aperture 18 to form a substantially plane wave light output.

Similarly, light 34 directed toward the planar reflective surface 28 of the support substrate 14 are reflected off the planar reflective surface 28 at a point near the parabolic focus (due to close proximity of the surface 28 and the supported light-emitting semiconductor device 12) and is subsequently collected by the curved reflector 16 to produce a further parallel light contribution 36 to the plane wave output. Those skilled in the art will particularly appreciate that this light collection mode collects light directed toward the bonding interface between the semiconductor device 12 and the support substrate 14 in the case of a light emitting semiconductor device 12 having a translucent substrate. Light 40 emanating from the light emitting semiconductor device 12 that is directed toward the opening or light aperture 18 directly contributes to the plane wave output. However, the contribution of the direct light 40 to the total light output is typically small due to the substantially directed light produced by LEDs and VCSELs.

Figure 3:
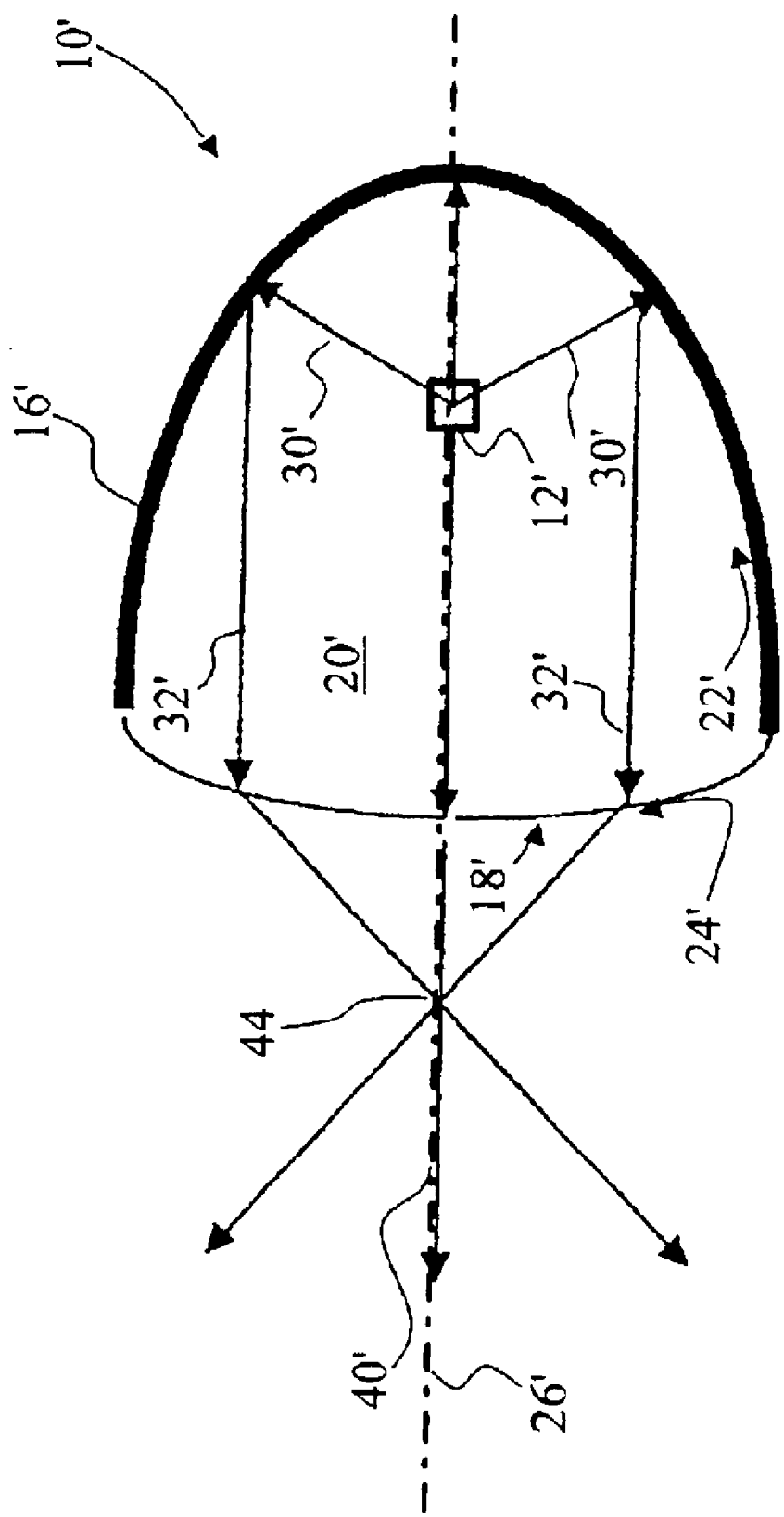
FIG. 3 shows a view from below of a second embodiment of a light source which includes a lensing light aperture. In this FIGURE, the planar reflective substrate is removed to expose the light emitting semiconductor die, and the drawing further includes selected light ray traces.

With reference to FIG. 3, a light-focusing light source 10' is described. Components of the light source 10' that generally correspond with components of the light source 10 of FIGS. 1 and 2 are designated by corresponding primed reference numbers herein. The light source 10' is substantially similar to the light source 10 except that the substantially planar light-transmissive surface 24 that fills the opening or light aperture 18 of the light source 10 is replaced in the light source 10' by a lensing surface 24' which acts to focus light 32' that traverses the encapsulant 20' away from but substantially parallel to the parabolic axis 26'. In particular, the lensing surface 24' focuses light to an external focal point 44. The lensing surface 24' is preferably shaped into the lensing curvature after encapsulant formation using known lens polishing techniques. Alternatively, encapsulant 20' is injection molded using a mold that includes a surface corresponding to the lensing surface 24'.

Figure 4:
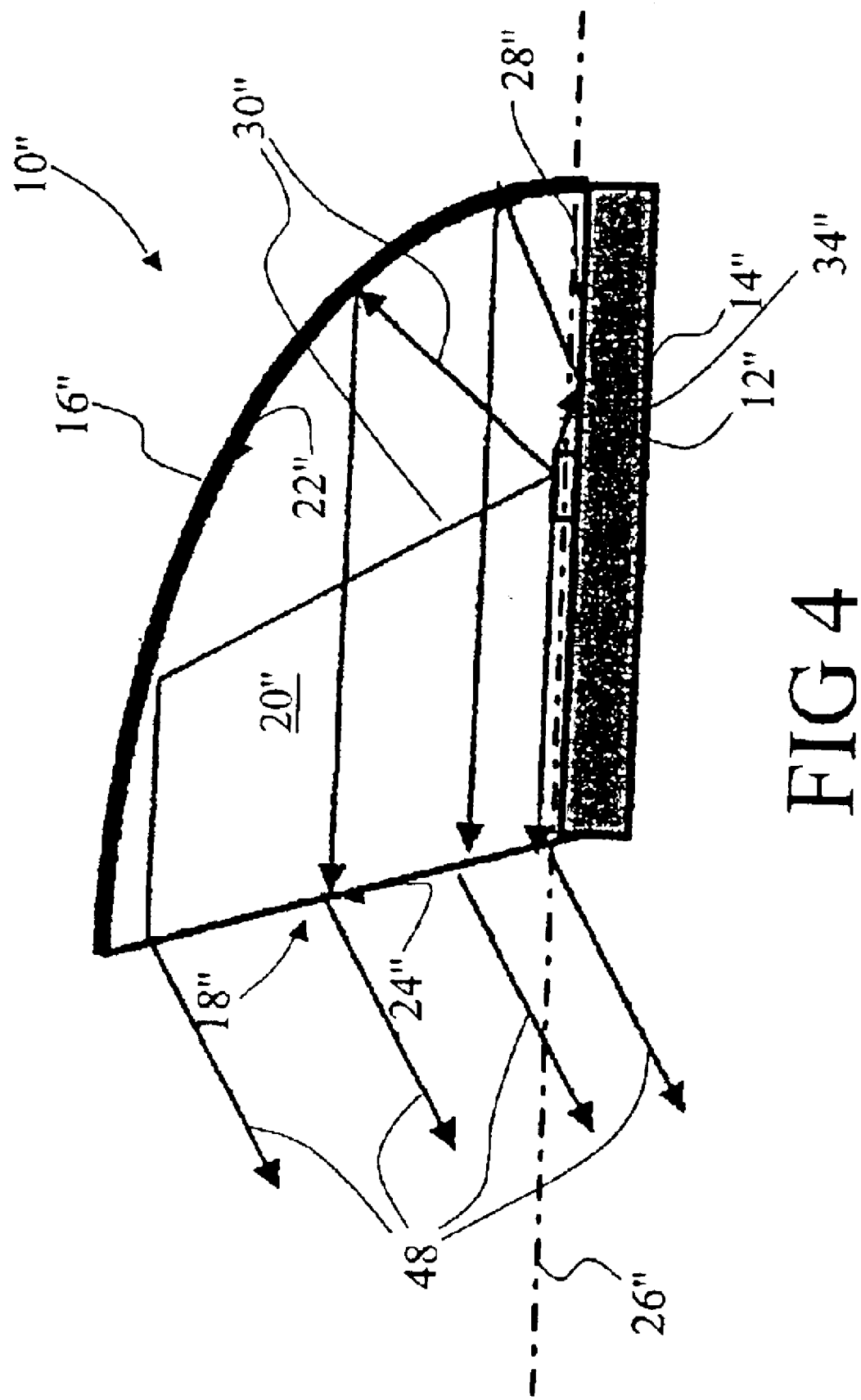
FIG. 4 shows a side sectional view of a third embodiment of a light source which includes a planar refractive aperture surface that produces a downwardly-directed light beam. Selected light ray traces are shown.

With reference to FIG. 4, a light source 10" is described which produces a downwardly directed planar wave light output. Components of the light source 10" that generally correspond with components of the light source 10 of FIGS. 1 and 2 are designated by corresponding double-primed reference numbers herein. The light source 10" is substantially similar to the light source 10 except that the substantially planar light-transmissive surface 24 that fills the opening or light aperture 18 of the light source 10 is replaced by a light-transmissive planar surface 24" oriented at a non-orthogonal angle tilted downward relative to an optical or parabola axis 26". The tilted light-transmissive surface 24" refracts substantially plane wave light 30" to produce a downwardly directed light output 48. The light-transmissive surface 24" is planarized or polished at the selected angle after encapsulant formation. Alternatively, encapsulant 20" is injection molded using a mold that includes a surface corresponding to the tilted surface 24".

Figure 5:
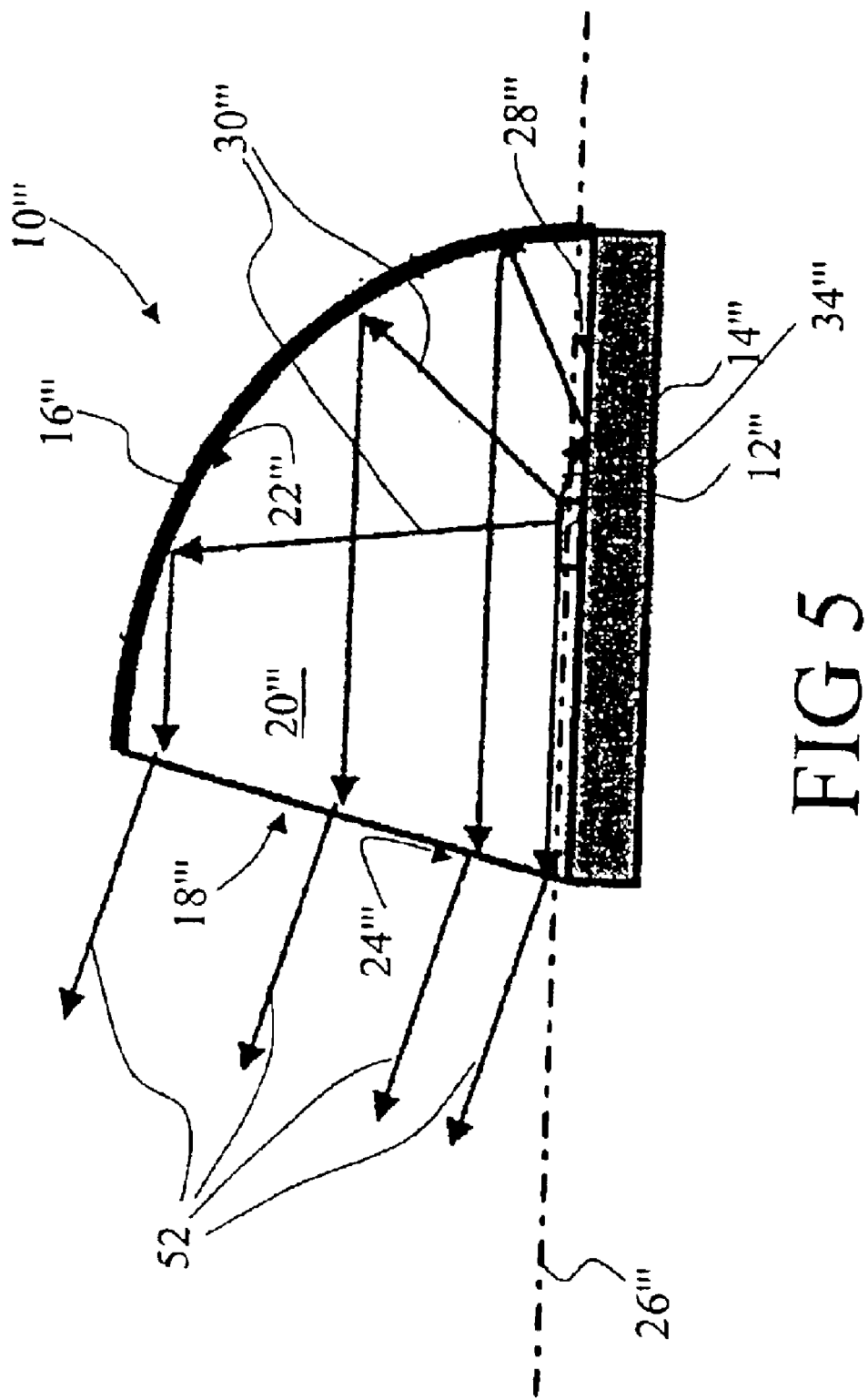
FIG. 5 shows a side sectional view of a fourth embodiment of a light source which includes a planar refractive aperture surface that produces an upwardly-directed light beam. Selected light ray traces are shown.

With reference to FIG. 5, a light source 10''' is described which produces an upwardly directed planar wave light output. Components of the light source 10''' that generally correspond with components of the light source 10 of FIGS. 1 and 2 are designated by corresponding triple-primed reference numbers herein. The light source 10''' is substantially similar to the light source 10 except that the substantially planar light-transmissive surface 24 that fills the opening or light aperture 18 of the light source 10 is replaced by a light-transmissive planar surface 24''' is oriented at a non-orthogonal angle tilted upward relative to an optical or parabola axis 26'''. The tilted light-transmissive surface 24''' refracts substantially plane wave light 30''' to produce an upwardly directed light output 52. The light-transmissive surface 24''' is planarized or polished at the selected angle after encapsulant formation. Alternatively, encapsulant 20''' is injection molded using a mold that includes a surface corresponding to the tilted surface 24'''.

Figure 6:
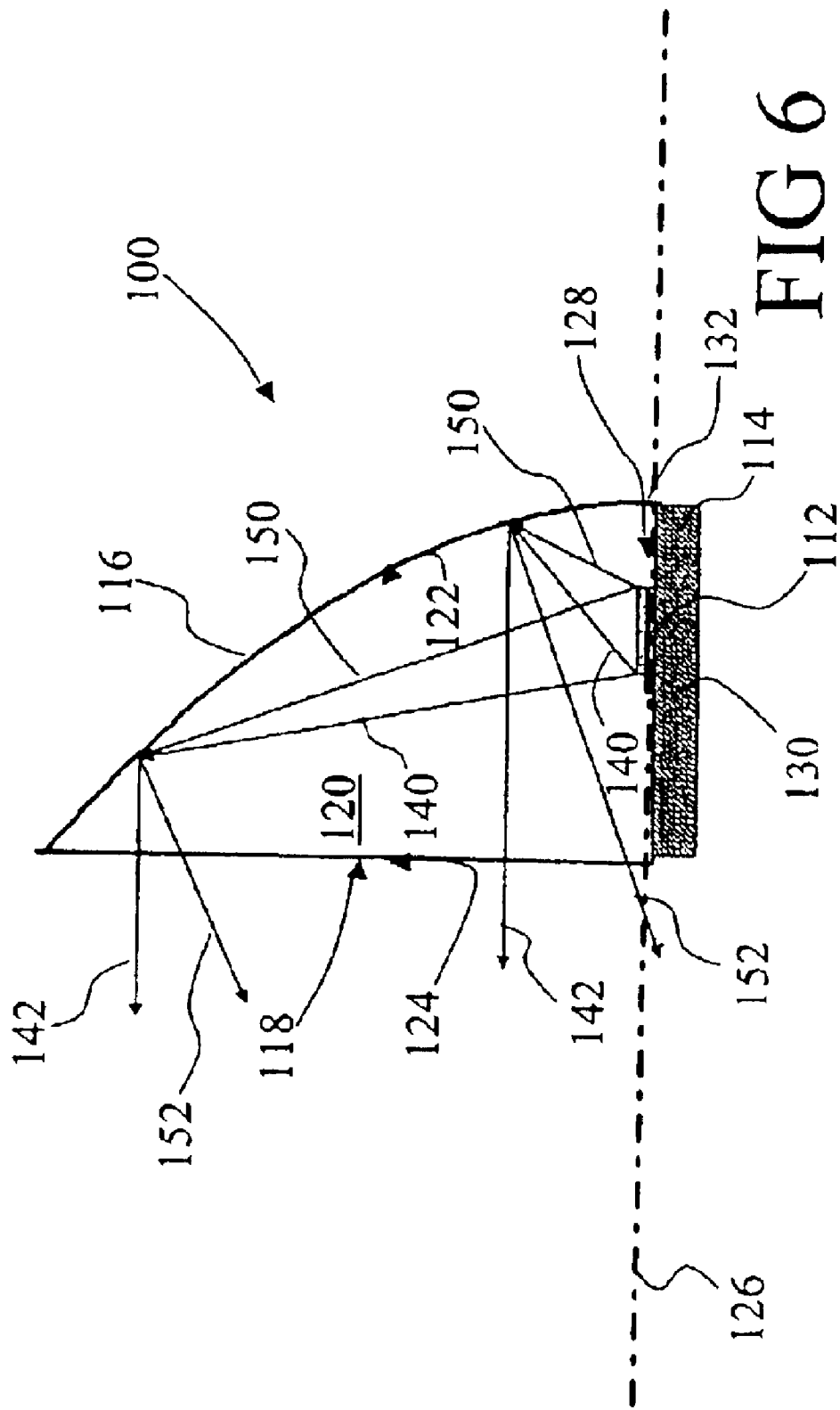
FIG. 6 shows a side sectional view of a fifth embodiment of a light source which includes a large-area light emitting semiconductor die for emitting a light beam with a sharp horizontal cutoff. Selected light ray traces are shown.

With reference to FIG. 6, a light source 100 includes a light emitting semiconductor device 112, a supporting substrate 114, a curved half-parabola reflector 116 that together with the supporting substrate 114 defines an opening or light aperture 118, and an optional encapsulant 120 filling a space between the supporting substrate 114 and the curved reflector 116 which are similar to correspondingly named elements of the light source 10 shown in FIGS. 1 and 2. The encapsulant 120 includes a curved surface 122 that comports with the curved reflector 116, and a substantially planar light-transmissive surface 124 that fills the opening or light aperture 118. The curved half-parabola reflector 116 defines an optical or parabola axis 126 that coincides with a substantially planar reflective surface 128 of the support substrate 114.

However, unlike the light source 10 shown in FIGS. 1 and 2, the light source 100 shown in FIG. 6 does not have the light emitting semiconductor device 112 arranged substantially centered on an optical focus 130 of the curved half-parabola reflector 116. Moreover, the light emitting semiconductor device 112 has a large aspect ratio with its large dimension running parallel to the optical or parabola axis 126. Optionally, the large aspect ratio of the light emitting semiconductor device 112 is achieved by using an array of semiconductor devices placed along the optical axis 126. The light emitting semiconductor device 112 has a first edge generally aligned with the optical focus 130 of the curved reflector 116, and a second edge positioned away from the focus 130 in a direction away from the opening or light aperture 118, i.e. the second edge is closer to a paraboloid vertex 132 of the curved half-parabola reflector 116 than is the first edge.

The asymmetrical position of the light emitting semiconductor device 112 relative to the optical focus 130 of the curved half-parabola reflector 116 has the effect of spreading the plane wave output downward. Light rays 140 emitted from a portion of the semiconductor device 112 near the first side emanate substantially from the optical focus 130, and so these rays are reflected and redirected by the curved reflector 116 into substantially parallel rays 142 that are parallel to the optical axis 126. However, light rays 150 emitted from a portion of the semiconductor device 112 near the second side emanate from points substantially distant from the optical focus 130, and so these rays are reflected and redirected by the curved reflector 116 into downwardly directed rays 152 as compared with the rays 140.

Figure 7:
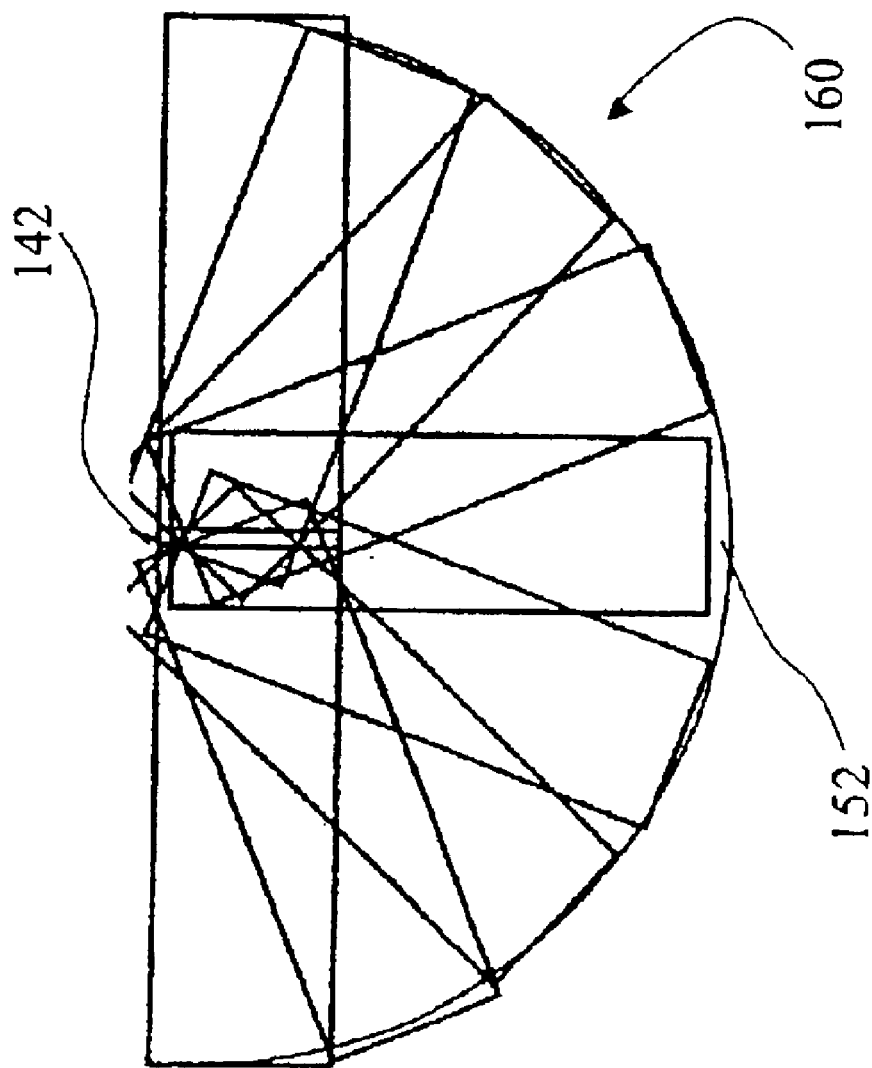
FIG. 7 shows a front view of a beam pattern for the fifth embodiment in which the large-area light emitting semiconductor die has a 3:1 aspect ratio.

With continuing reference to FIG. 6 and with further reference to FIG. 7, between the two extreme first and second sides light is emitted from a continuum of positions along the optical axis 126. The corresponding reflected and redirected rays fill an angular span between the substantially horizontal rays 142 and the maximally downwardly directed rays 152. FIG. 7 shows a light beam pattern or distribution 160 is produced by the light source 100, which spans between the substantially horizontal rays 142 and the maximally downwardly directed rays 152, the light distribution 160 has a sharp cutoff at the horizontal edge corresponding to the rays 142. Those skilled in the art will recognize that the beam pattern 160 is particularly suitable for low-beam headlights which should produce limited light directed above the horizontal.

It will also be appreciated that in a light source (not shown) in which portions of the light emitting semiconductor device are arranged between the optical focus and the light aperture, light from those portions will be reflected and redirected upward. A high-aspect ratio light emitting semiconductor device (or array of semiconductor devices) that is symmetrically centered on the optical focus with significant extent along the optical axis on both sides of the optical focus will produce light in a substantially symmetrical distribution pattern, typically having a circular or ellipsoidal beam cross-section, which is particularly suitable for high-beam headlights.

In general, placing the light emitting semiconductor device slightly behind the focal point (the arrangement of the light source 100 of FIG. 7) produces the semicircular beam pattern 160 below the horizontal with a sharp beam cutoff at the horizontal. Similarly, placing the light emitting semiconductor device slightly ahead the focal point produces a semicircular beam pattern above the horizontal with a sharp beam cutoff at the horizontal. In either arrangement optional further optics can be included, such as a refractive lens disposed at or near the open end of the half-paraboloid reflector, to spread or otherwise modify the beam pattern while substantially retaining the sharp cutoff at the horizontal. Placing the light emitting semiconductor device substantially centered at the focal point produces a generally circular beam pattern.

Figure 8:
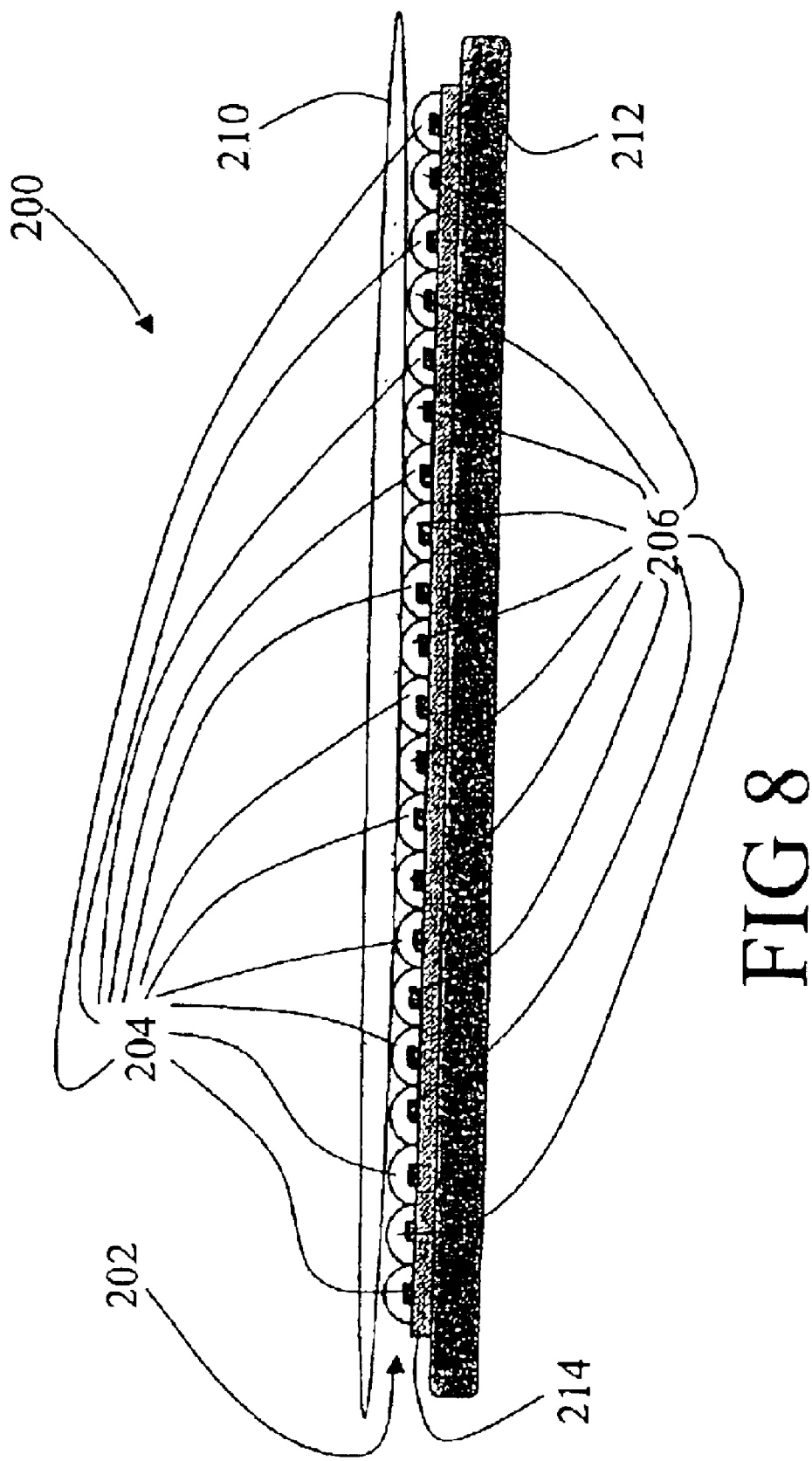
FIG. 8 shows a front view of a preferred embodiment for a low-profile headlight embodiment of the invention.
Figure 9:
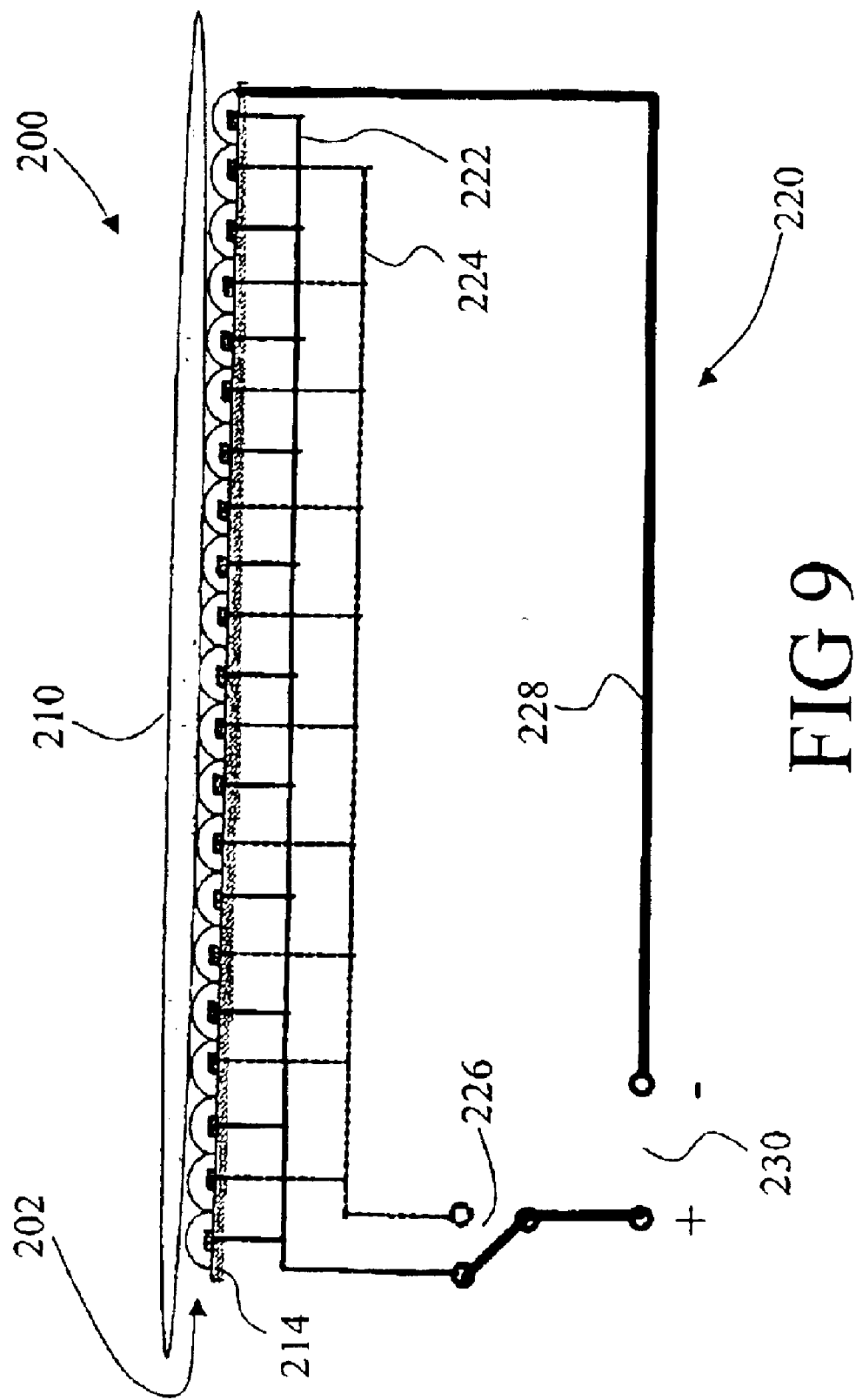
FIG. 9 schematically shows an exemplary circuit for selectively producing one of a high-beam and a low-beam using the headlight embodiment of FIG. 8.

With reference to FIGS. 8 and 9, a headlight 200 includes a linear array 202 of light source elements. Specifically, the light sources array 202 includes low-beam light source elements 204 alternating with high-beam light source elements 206. The low-beam light source elements 204 are preferably substantially similar to the light source 100, and each including the high aspect-ratio light emitting semiconductor element 112 arranged asymmetrically with respect to the optical focal point 130 to produce the downwardly directed light beam pattern 160. The high-beam light source elements 206 are preferably similar to the light source 100 except for having the high aspect-ratio light emitting semiconductor element arranged substantially symmetrically at the optical focal point to produce a generally forwardly directed light beam pattern.

The linear array 202 is disposed between an upper grill or hood 210 and a lower bumper 212 of a vehicle. The linear light sources array 202 is arranged on a substrate 214 which is preferably a printed circuit board that includes electrical traces defining a power circuit 220 which is shown schematically in FIG. 9. The power circuit 220 includes low-beam light source element connections 222 (shown as solid lines in FIG. 9) and high-beam light source element connections 224 (shown as dotted lines in FIG. 9). A switch 226 selectively connects one of the low-beam light source element connections 222 and the high-beam light source element connections 224 to a circuit ground 228 to complete an electrical circuit and energize the connected light source elements. Hence, when power is applied at input terminals 230, the selected one of the high-beams and the low-beams are energized. The light source elements 204, 206 of the array 202 are arranged such that the plurality of light emission modules produce a cumulative high-beam or low-beam depending upon a setting of the switch 226. Preferably, the circuit ground 228 is a ground plane of the printed circuit board substrate 214.

The circuit board substrate 214 is preferably thermally conductive or includes thermal conduction paths for heat sinking the light source elements 204, 206. In a preferred embodiment, the substrate 214 provides a thermal conduction path to the lower bumper 212 which acts as a large-capacity heat sink.

Rather than using a printed circuit board, the light source array can be a monolithic semiconductor device array with deposited electrical traces that define the power circuit. In yet another variation, the printed circuit board can be replaced by a structural support and a wiring harness that suitably electrically connects the high-beam light sources and the low-beam light sources. Those skilled in the art can make additional and/or different modifications to adapt the headlight 200 for specific vehicle configurations and/or manufacturing resources.

Those skilled in the art will appreciate the aerodynamic and aesthetic benefits of the headlight 200 over existing incandescent and high-intensity discharge lamps. The headlight 200 has a low profile which reduces aerodynamic resistance and allows automobile designers to produce cars with innovative, sleek front ends. Moreover, the headlight 200 integrates the high-beams and the low-beams into a single headlight unit. It will be further appreciated that the headlight 200 optionally spans an entire central portion of a vehicle front end. That is, rather than having two distinct headlights on the left and right sides of the vehicle, the headlight 200 can span the front end as a single high aspect-ratio headlight to provide increased illumination. Yet another advantage of the headlight 200 is that damage due to stones or other highway debris impacting the headlight 200 typically will not cause catastrophic loss of illumination. Rather, those light source elements 204, 206 damaged by the impact may fail, but other ones of the light source elements 204, 206 which are not impacted will typically continue to operate.

Although an exemplary headlight application has been described with particular reference to FIGS. 7, 8 and 9, it will be appreciated that the light source embodiments described with reference to FIGS. 1–7 can be used in many other types of lighting applications.

Figure 10:
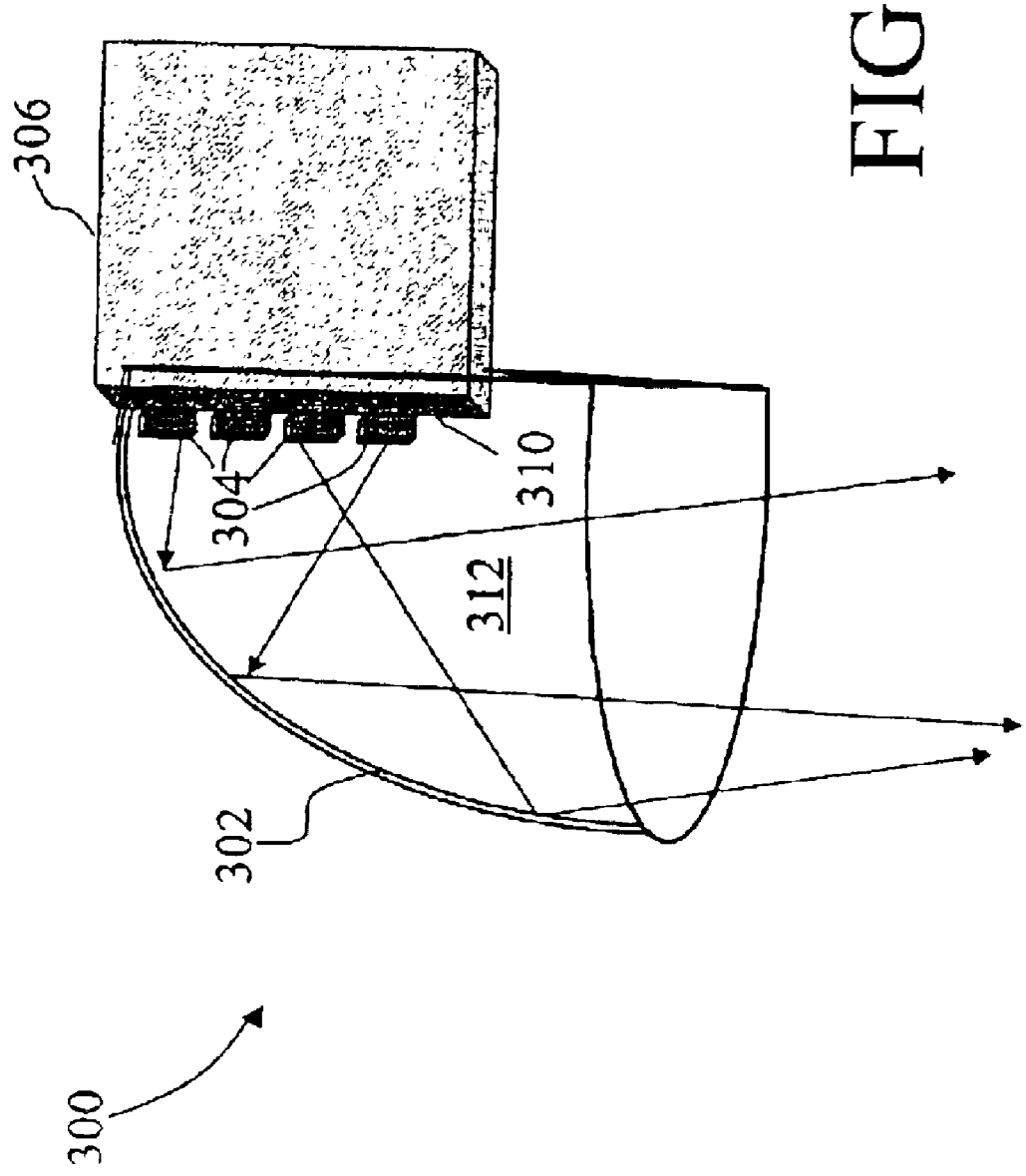
FIG. 10 shows a perspective view of an exemplary downlight that includes a plurality of light emitting semiconductor devices and a half-parabola reflector.

With reference to FIG. 10, for example, a downlighting fixture 300 includes a half-parabola reflector 302 arranged to downwardly direct light produced by a linear array of light emitting semiconductor devices 304 connected with a heat sink 306. Because the light emitting semiconductor devices 304 are arranged about a focal point of the reflector 302 and extend substantially on either side of the focal point along an optical axis of the reflector 302, the light is emitted over a spread beam pattern, as described previously with particular reference to FIGS. 6 and 7. Optionally, a surface 310 of the heat sink 306 is arranged as a substantially planar reflective surface that contributes to the light output as described previously with particular reference to FIG. 1.

In the downlighting fixture 300, the half-parabola reflector 302 is suitably constructed as an aluminum reflector made of shaped aluminum sheet metal. Preferably, an inner space 312 of the half-parabola reflector 302 is empty, that is, air-filled, rather than containing an encapsulant. (As is known in the art, the light emitting semiconductor devices 304 typically each include an encapsulant sealing the semiconductor die). By combining a plurality of high-intensity light emitting semiconductor devices 304, such as high intensity white LEDs, on the common heat sink 306, with the reflector 302 a high-intensity downlight is constructed that produces a substantially downwardly directed light beam with a beam spread determined in large part by the distribution of the semiconductor devices 304 along the surface 310 of the heat sink 306.

Figure 11:
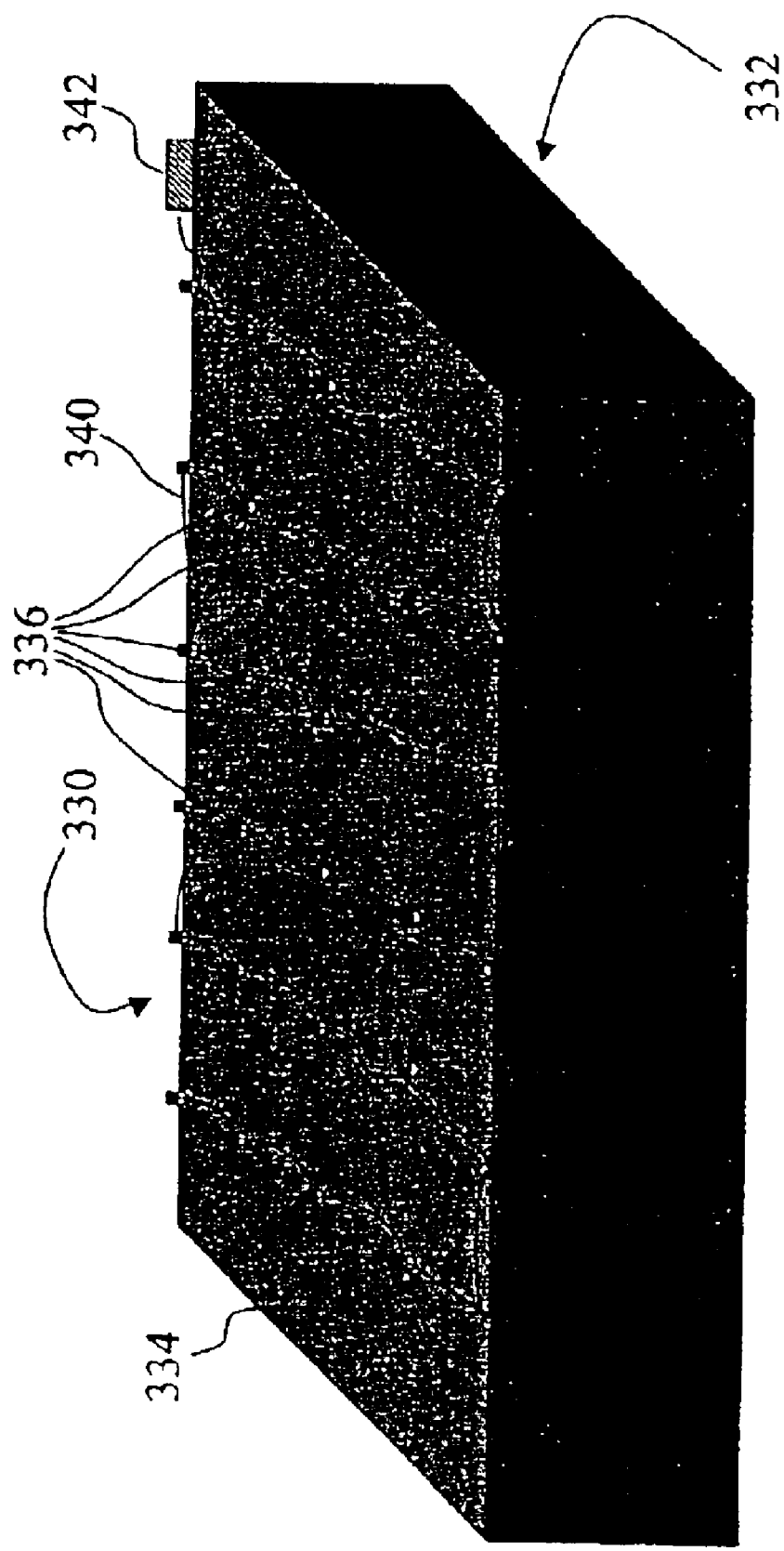
FIG. 11 schematically shows a room lighting arrangement employing a plurality of light sources each including a light emitting semiconductor device and corresponding reflector.

With reference to FIG. 11, a distributed downlighting system 330 illuminates a room 332 that is schematically represented as a shaded rectangle including a ceiling 334 on which the downlighting system 330 is disposed. An array of light sources 336 selected from the light sources 10, 10', 10", 10''', 100 are distributed across the ceiling 334 to provide tailored light distributions that are directed vertically downward, downward at a slanted angle, or are selectively focused. The opening or light aperture 18, 18', 18", 18''', 118 of each light source 336 faces downward from the ceiling 334 to produce generally downwardly directed illumination. The light sources 336 are electrically interconnected by an electrical cord 340 that suitably includes positive and negative parallel conductors (not shown) that connect with positive and negative electrodes (not shown) of each light source 336. A single constant-current power transformer 342 receives house electrical power and converts the received power to a constant current applied to the cord 340 to power the light sources 336. Of course, more than one power supply can be used to illuminate larger areas.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light source comprising:

a light emitting semiconductor device; and a support substrate having a generally planar reflective surface that supports the semiconductor device, the light emitting semiconductor device heat sinking via the support substrate; and a curved reflector having a concave reflective surface, the light emitting semiconductor device arranged between the generally planar reflective surface and the concave reflective surface, the support substrate and the curved reflector together defining a light aperture through which light produced by the light emitting semiconductor device passes.

2. The light source as set forth in claim 1, wherein the planar reflective surface and the concave reflective surface cooperate to reflect light produced by the light emitting semiconductor device that is directed toward one of the planar reflective surface and the concave reflective surface toward the light aperture along a direction generally parallel to an optical axis of the concave surface.

3. The light source as set forth in claim 1, wherein an optical axis of the concave surface coincides with the planar reflective surface.

4. The light source as set forth in claim 1, wherein the light emitting semiconductor device is centered at an optical focus of the concave surface.

5. The light source as set forth in claim 1, wherein the light emitting semiconductor device is positioned with a first edge substantially aligned with an optical focus of the concave surface, the light emitting semiconductor device extending from the first edge away from the light aperture.

6. The light source as set forth in claim 1, wherein the light emitting semiconductor device is positioned with a first edge substantially aligned with an optical focus of the concave surface, the light emitting semiconductor device extending from the first edge away from the optical focus along an optical axis of the concave surface.

7. A light source comprising:

a light emitting semiconductor device;

a support substrate having a generally planar reflective surface that supports the semiconductor device, the light emitting semiconductor device heat sinking via the support substrate; and a curved reflector having a concave reflective surface, the light emitting semiconductor device arranged between the generally planar reflective surface and the concave reflective surface, the support substrate and the curved reflector together defining a light aperture through which light produced by the light emitting semiconductor device passes, the curved reflector including:
  a light transmissive encapsulant that encapsulates the light emitting semiconductor device and at least a portion of the generally planar reflective surface, the encapsulant including a convex generally parabolic encapsulant surface; and
  a reflective layer disposed on the convex generally parabolic encapsulant surface, an interface between the reflective layer and the encapsulant corresponding to the concave generally parabolic surface of the curved reflector.

8. The light source as set forth in claim 7, wherein the tight transmissive encapsulant includes a light transmissive refractive surface coinciding with the light aperture, the refractive surface refracting light produced by the light emitting semiconductor device as it passes through the light aperture.

9. The light source as set forth in claim 8, wherein the light transmissive refractive surface defines a lens that focuses the light passing through the light aperture to a focal point.

10. The light source as set forth in claim 8, wherein the light transmissive refractive surface is generally planar, and a surface normal of the light transmissive refractive surface is arranged at a non-zero angle with respect to an optical axis of the reflector.

11. The light source as set forth in claim 1, wherein the light emitting semiconductor device is a light emitting diode having a direction of strongest light emission directed perpendicularly to the generally planar reflective surface and away therefrom.

12. The light source as set forth in claim 1, further including:
  a plurality of light emitting semiconductor devices each device having an associated curved reflector, wherein each light emitting semiconductor device and each associated curved reflector define a light emission module, the light source including a plurality of light emitting modules arranged on the support substrate.

13. A light source comprising:
  a light emitting semiconductor device;
  a support substrate having a generally planar reflective surface that supports the semiconductor device; and
  a curved reflector having a concave reflective surface, the light emitting semiconductor device arranged between the generally planar reflective surface and the concave reflective surface, the support substrate and the curved reflector together defining a light aperture through which light produced by the light emitting semiconductor device passes, wherein the light emitting semiconductor device, the curved reflector, and the support substrate define a light emission module, the light source further including:
    a support structure;
    a plurality of first light emission modules arranged on the support structure and emitting light directed away from the support structure at a first angle; and
    a plurality of second light emission modules arranged on the support structure and emitting light directed away from the support structure at a second angle different from the first angle, the second light emission modules being interspersed among the first light emission modules.

14. The light source as set forth in claim 13, further including:
  a power circuit that selectively supplies power to one of the first light emission modules and the second light emission modules to produce one of a first beam directed at the first angle and a second beam directed at the second angle, respectively.

15. The light source as set forth in claim 1, wherein the light emitting semiconductor device includes a monolithic array of light emitting semiconductor device elements, the support substrate includes the monolithic substrate, and the curved reflector includes a plurality of curved reflectors corresponding to the light emitting semiconductor device array elements, the light source further including:
  a plurality of encapsulant forms corresponding to the light emitting semiconductor device array elements, each encapsulant form encapsulating the corresponding light emitting semiconductor device array element and including a curved surface defining a curvature of the curved reflector.

16. The light source as set forth in claim 15, wherein the elements of the light emitting semiconductor device array are selected from a group consisting of light emitting diodes and vertical cavity surface emitting lasers.

17. A headlight for a vehicle, the headlight comprising:
  a support surface; and
  a plurality of light emission modules each including:
    a reflective cup including a planar portion and a parabolic portion joined together at a parabolic interface, an open end of the parabolic portion defining a light output opening, and
    a light emitting semiconductor die attached to the planar portion of the reflective cup and oriented to produce light directed toward the parabolic portion of the reflective cup,
  wherein the light emission modules are arranged on the support surface with the planar portion of each reflective cup parallel to the support surface and the light output openings of the reflective cups and arranged such that the plurality of light emission modules produce a cumulative light beam and include:
    low beam light emission modules that produce light directed at a low beam angle relative to an axis of the interface; and
    high beam light emission modules that produce light directed at a high beam angle relative to the axis of the interface, the high beam angle being smaller than the low beam angle.

18. The headlight as set forth in claim 17, wherein each light emission module further includes:
  a light-transmissive material that fills the reflective cup and seals the light emitting semiconductor die.

19. The headlight as set forth in claim 18, wherein the parabolic portion of the reflective cup includes a reflective film disposed on the light-transmissive material.

20. The headlight as set forth in claim 17, wherein the light emitting semiconductor die of each low beam light emission module has an edge aligned with a focus of the parabolic portion of the reflective cup and extends laterally away from the light output opening along the planar portion of the reflective cup.

21. The headlight as set forth in claim 17, wherein the light emitting semiconductor die of each high beam light emission module is centered at a focus of the parabolic portion of the reflective cup.

22. The headlight as set forth in claim 17, wherein each light emission module further includes:
- a light-transmissive encapsulant material filling the reflective cup, the light transmissive material having a light-transmissive surface at the light output opening, the light transmissive surface being orthogonal to the planar portion of the reflector cup for the high beam light emission modules and the light transmissive surface being tilted downward from orthogonal to the planar portion of the reflector cup for the low beam light emission modules.

23. The headlight as set forth in claim 17, wherein the support surface is a portion of a heat sink and the reflective cups are thermally conductive to provide heat sinking of the light emitting semiconductor dice.

24. The headlight as set forth in claim 17, wherein the support surface and the reflective cups are thermally conductive and the support surface is disposed on a bumper of the vehicle, the bumper serving as a heat sink for the headlight.

25. A solid-state light source including:
- a solid-state light emitting device; and
- a reflector including a generally planar side and a generally concave curved side facing the generally planar side, the solid-state light emitting device supported by the generally planar side, which provides primary heat sinking for the light emitting device, and emitting light generally directed toward the concave curved side, the reflector further including an opening defined by edges of the generally planar side and the generally concave curved side, toward which opening the generally planar side and the generally concave curved side cooperatively direct light produced by the solid-state light emitting device; and
- a translucent or transparent filling material filling the reflector and having an light-transmissive surface disposed at the reflector opening which translucent or transparent filling material is arranged at a non-perpendicular angle to the generally planar side to refractively tilt the light.

26. The solid-state light source as set forth in claim 25, wherein the light-transmissive surface defines a lens for focusing the light.

27. The solid-state light source as set forth in claim 25, wherein the generally concave curved side defines a half-parabolic reflector.

28. The solid-state light source as set forth in claim 27, wherein a parabolic axis of the half-parabolic reflector lies on or near the generally planar side.

29. The solid-state light source as set forth in claim 27, wherein the solid-state light emitting device is arranged asymmetrically along the parabolic axis respective to a focal point of the half-parabolic reflector such that an asymmetrical beam pattern with a sharp cutoff is produced by the solid-state light source.

30. The solid-state light source as set forth in claim 25, wherein the generally planar side and the generally concave curved side cooperatively direct light produced by the solid-state light emitting device parallel to the generally planar side.

31. A method for manufacturing a light source, the method including:
- securing a light emitting semiconductor die to a reflective planar surface;
- heat sinking the light emitting semiconductor via the planar surface;
- applying an encapsulant over the light emitting semiconductor die to seal the die, the applying defining an encapsulant surface having an aperture side and a curved side; and
- applying a reflective layer to the curved side of the encapsulant.

32. The method as set forth in claim 31, wherein the applying of an encapsulant includes:
- arranging a mold defining at least the curved side of the encapsulant onto the reflective planar surface to define a mold cavity;
- disposing the encapsulant in a liquid or flowing solid form into the mold cavity; and
- removing the mold after the encapsulant has solidified.

33. The method as set forth in claim 32, wherein the applying of an encapsulant further includes:
- polishing the aperture side of the solidified encapsulant to define a selected refractive surface.

34. The method as set forth in claim 31, further including:
- repeating the steps of securing a light emitting semiconductor die, applying an encapsulant, and applying a reflective layer for a plurality of light emitting semiconductor dice to define a linear light source array.

35. The method as set forth in claim 31, wherein the curved side of the encapsulant surface has a paraboloid curvature.

36. The method as set forth in claim 31, wherein the step of applying a reflective layer includes:
- depositing a metal layer on the curved side of the encapsulant surface.

37. The method as set forth in claim 36, wherein the step of applying a reflective layer further includes:
- prior to depositing a metal layer, masking the aperture side of the encapsulant to prevent metal deposition thereon during the depositing.

38. The method as set forth in claim 31, wherein the reflective planar surface includes a high thermal capacity to provide heat sinking for the light emitting semiconductor die.

* * * * *